US012769923B2

(12) United States Patent
Topaloglu et al.

(10) Patent No.: US 12,769,923 B2
(45) Date of Patent: Oct. 20, 2026

(54) YIELDING AND ROUTABLE CIRCUIT CO-DESIGN USING VIABARS

(71) Applicant: INTERNATIONAL BUSINESS MACHINES CORPORATION, Armonk, NY (US)

(72) Inventors: Rasit Onur Topaloglu, Poughkeepsie, NY (US); Leon Sigal, Monsey, NY (US); Henry A. Bonges, III, Milton, VT (US); Robert Arelt, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 758 days.

(21) Appl. No.: 18/344,788

(22) Filed: Jun. 29, 2023

(65) Prior Publication Data

US 2025/0005252 A1 Jan. 2, 2025

(51) Int. Cl.

| | |
|---|---|
| ***G06F 30/3953*** | (2020.01) |
| ***G06F 30/3947*** | (2020.01) |
| ***G06F 30/398*** | (2020.01) |
| ***H01L 23/528*** | (2006.01) |
| ***H01L 23/538*** | (2006.01) |

(52) U.S. Cl.

CPC ...... *G06F 30/3953* (2020.01); *G06F 30/3947* (2020.01); *G06F 30/398* (2020.01)

(58) Field of Classification Search

CPC ............. G06F 30/3953; G06F 30/3947; G06F 30/398; H01L 23/481; H01L 23/528; H01L 23/538; H01L 24/28; H01L 2223/6616

USPC ........ 716/130, 129; 703/14; 326/101, 41, 47

See application file for complete search history.

(56) References Cited

U.S. PATENT DOCUMENTS

| | | | | |
|---|---|---|---|---|
| 5,425,982 | A | 6/1995 | Hara | |
| 5,620,916 | A | 4/1997 | Eden et al. | |
| 8,020,133 | B2 | 9/2011 | Nishimuda | |
| 8,299,622 | B2 | 10/2012 | Chidambarrao et al. | |
| 8,405,224 | B2 | 3/2013 | Itoh | |
| 8,863,048 | B1 * | 10/2014 | Gerousis ............... | G06F 30/392 716/55 |
| 9,208,277 | B1 * | 12/2015 | Lamant ................. | G06F 30/392 |
| 10,552,567 | B2 | 2/2020 | Civay et al. | |
| 2006/0027919 | A1 * | 2/2006 | Ali ...................... | H10W 20/031 257/E21.582 |
| 2006/0064653 | A1 | 3/2006 | Zhang et al. | |

(Continued)

FOREIGN PATENT DOCUMENTS

| | | | | |
|---|---|---|---|---|
| CN | 1979507 A * | 6/2007 | ........... | G06F 30/394 |
| EP | 3732595 A1 * | 11/2020 | | |

*Primary Examiner* — Phallaka Kik

(74) *Attorney, Agent, or Firm* — Onyx IP Group

(57) ABSTRACT

Yielding and routable circuit co-design using viabars, including: creating, in a first metal layer of an integrated circuit design, a first interconnect having a slack portion vertically coinciding with a second interconnect of a second metal layer of the integrated circuit design; creating, in the integrated circuit design, a first via interconnecting the first interconnect and the second interconnect; determining, after block-level signal routing of the integrated circuit design and based on one or more design rules, that the first via can be extended into the slack portion; and extending, based on the determination that the first via can be extended, the first via into a viabar interconnecting the first metal layer and the second metal layer.

20 Claims, 12 Drawing Sheets

(56) References Cited

U.S. PATENT DOCUMENTS

| | | | | |
|---|---|---|---|---|
| 2006/0101367 | A1* | 5/2006 | Fujita | G06F 30/398<br>716/139 |
| 2009/0158231 | A1* | 6/2009 | Anderson | G06F 30/39<br>716/122 |
| 2010/0242008 | A1* | 9/2010 | Liu | G06F 30/392<br>716/108 |
| 2014/0332979 | A1* | 11/2014 | Cicalo | G06F 30/39<br>257/774 |
| 2018/0321822 | A1* | 11/2018 | Qian | G06F 30/31 |
| 2019/0258767 | A1* | 8/2019 | Young | G06F 30/347 |

* cited by examiner

YIELDING AND ROUTABLE CIRCUIT CO-DESIGN USING VIABARS

BACKGROUND

Field of the Invention

The field of the invention is data processing, or, more specifically, methods and integrated circuits for yielding and routable circuit co-design using viabars.

Description of Related Art

Rectangular viabars may be used instead of or in addition to vias to connect metal layers of a block of an integrated circuit. The use of viabars can improve chip yield compared to standard square vias. However, using viabars instead of standard square vias results in additional free space usage. As routing must conform to various design rules, the increased use of free space may make routing more difficult or impossible if viabars are overused.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

SUMMARY

Yielding and routable circuit co-design using viabars, including: creating, in a first metal layer of an integrated circuit design, a first interconnect having a slack portion vertically coinciding with a second interconnect of a second metal layer of the integrated circuit design; creating, in the integrated circuit design, a first via interconnecting the first interconnect and the second interconnect; determining, after block-level signal routing of the integrated circuit design and based on one or more design rules, that the first via can be extended into the slack portion; and extending, based on the determination that the first via can be extended, the first via into a viabar interconnecting the first metal layer and the second metal layer.

DETAILED DESCRIPTION

Figure 1A:
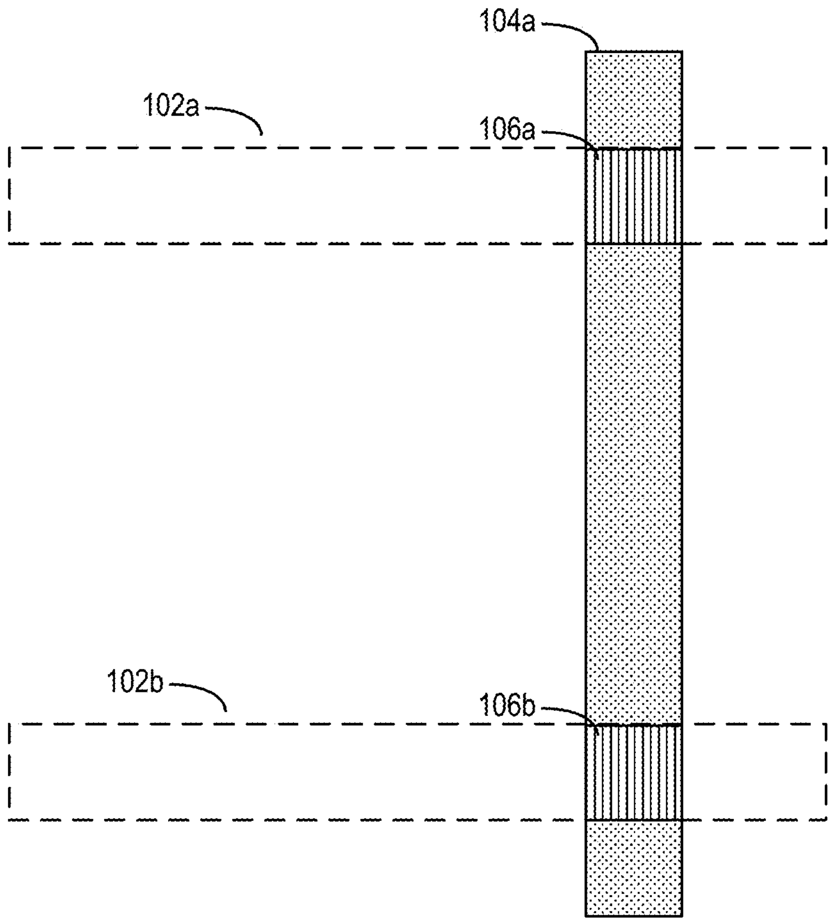
PRIOR ART FIG. 1A
FIG. 1A shows an example diagram for via placement in integrated circuit designs.
Figure 1B:
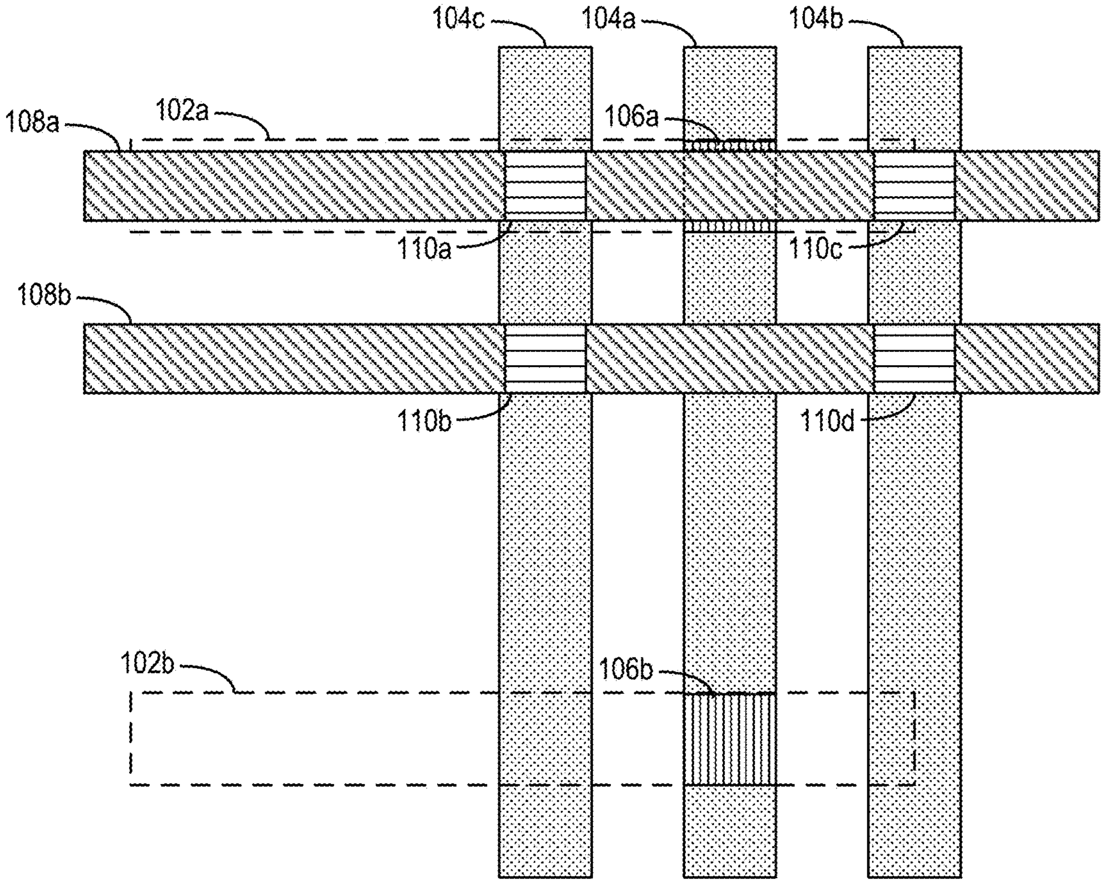
PRIOR ART FIG. 1B
FIG. 1B shows an example diagram for via placement in integrated circuit designs.
Figure 1C:
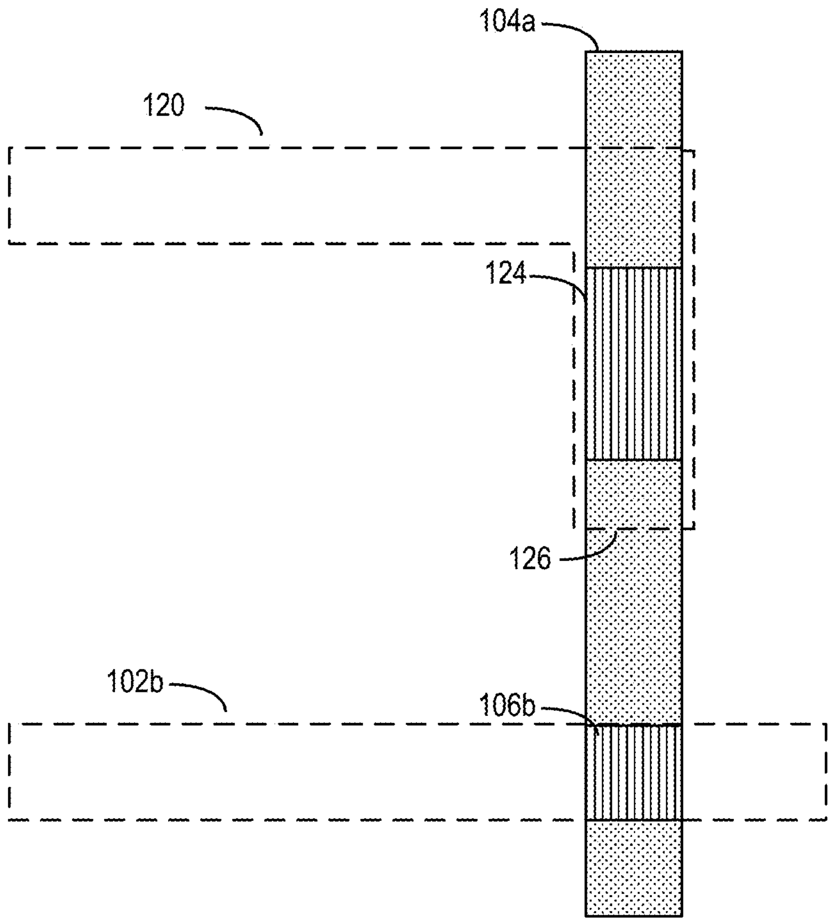
PRIOR ART FIG. 1C
FIG. 1C shows an example diagram for via placement in integrated circuit designs.

FIGS. 1A-1C show example diagrams for via placement in integrated circuit designs according to approaches known in the art. Beginning with FIG. 1A, an illustrative diagram of via placement to interconnect metal layers in an integrated circuit is shown. Interconnects 102*a* and 102*b* are located in a first metal layer of an integrated circuit. The interconnects 102*a,b*, as well as other interconnects referred to herein, may include wires or other signal pathways as can be appreciated. Interconnect 104*a* is located in a second metal layer of the integrated circuit. The second metal layer may be above or below the first metal layer. Additionally, the second metal layer may be separated from the first metal layer by one or more intermediate layers. As shown, interconnects 102*a,b* are perpendicular to the interconnect 104*a*.

The first metal layer is interconnected to the second metal layer using vias 106*a,b*. Here, the via 106*a* interconnects the interconnect 102*a* in the first metal layer to the interconnect 104*a* in the second metal layer while the via 106*ab* interconnects the interconnect 102*ab* in the first metal layer to the interconnect 104*a* in the second metal layer. In some embodiments, the vias 106*a,b* may be square or substantially square. The vias 106*a,b* are placed at locations where the interconnect 104*a* vertically coincides with the interconnect 102*a,b*, respectively.

Turning now to FIG. 1B, another illustrative diagram of via placement to interconnect metal layers in an integrated circuit is shown. FIG. 1B is similar to FIG. 1A, differing in that FIG. 1B includes interconnects 108*a,b* located in a third metal layer of the integrated circuit. Though the interconnects 108*a,b* are shown as having a width less than the interconnects 102*a,b* or 104*a-c*, it is understood that this is merely illustrative for the purpose of clarity and that these interconnects, as well as other elements shown in the figures, are not depicted necessarily to scale. Moreover, it is understood that, while some figures may not show an amount of enclosing material around a via or viabar, it is understood that this is also omitted for clarity and that the enclosing material may be present in some embodiments.

FIG. 1B also includes interconnects 104*b,c* in the second metal layer. The third metal layer is interconnected to the second metal layer using vias 110*a,b,c,d*. For example, while the first and second metal layer may include cells or components added during a placement stage of design (e.g., before routing), the third metal layer may include wiring (e.g., interconnects 108*a,b*) added to an integrated circuit chip design during the routing stage. Here, vias 110*a,b* interconnect the interconnect 104*c* in the second metal layer to interconnects 108*a,b*, respectively, in the third metal layer while vias 110*c,d* interconnect the interconnect 104*b* in the second metal layer to interconnects 108*a,b*, respectively, in the third metal layer. As with the via 106*a*, the vias 110*a-d* may be substantially square in shape.

Integrated circuits may be required to conform to one or more design rules that describe how components, connections, and the like may be positioned within an integrated circuit. As an example, the one or more design rules may define a minimum distance (e.g., a minimum separation) between vias. The minimum distance may be measured, for example, from the center of one via to another, from the edge of one via to another, and the like. In FIG. 1B, the vias 110*a-d* satisfy a minimum distance between vias relative to the via 106*a*.

FIG. 1C sets forth another illustrative diagram of via placement to interconnect metal layers in an integrated circuit is shown. FIG. 1C is similar to FIG. 1A, differing that an interconnect 120 is used instead of an interconnect 102*a* in the first metal layer. The interconnect 120 differs in shape from the interconnect 102*a* in that the interconnect 120 includes a slack portion 126. The slack portion 126 is a portion of an interconnect 102*a* that extends from another portion of the interconnect 102*a* in a different direction. Here, the slack portion 126 extends orthogonally from another portion of the interconnect 102*a*, forming a right angle shape. Particularly, the slack portion 126 extends such that it is parallel to the interconnect 104*a* in the second metal layer. Thus, a greater area of the interconnect 120 vertically coincides with the interconnect 104*a* compared to the interconnect 102*a*.

FIGS. 1A and 1B rely on square vias 106*a,b* and 110*a-d* to interconnect the various metal layers. In contrast, FIG. 1C uses a viabar 124. Due to the greater amount of vertically coinciding area between the interconnect 120 and the interconnect 104*a*, a viabar 124 having a greater area than a via 106*a* may be used. In some embodiments, the viabar 124 may have a width equal or substantially similar to other vias in the integrated circuit, such as square vias including vias 106*a,b*. The viabar 124 has a length grater than standard square vias (e.g., vias 106*a,b*). For example, in some embodiments, the viabar 124 may have a length equal or substantially equal to twice the length of a standard square via in the same integrated circuit. In other words, a viabar 124 may have an aspect ratio of 1:2 compared to square vias having an aspect ratio of 1:1. In some embodiments, the viabar 124 may have another length greater than that of a standard square via in the same integrated circuit. The use of viabars instead of standard square vias to interconnect metal layers in an integrated circuit results in a greater yield during chip manufacturing. Viabars also have comparatively smaller resistance, reducing interconnect RC delay.

Figure 1D:
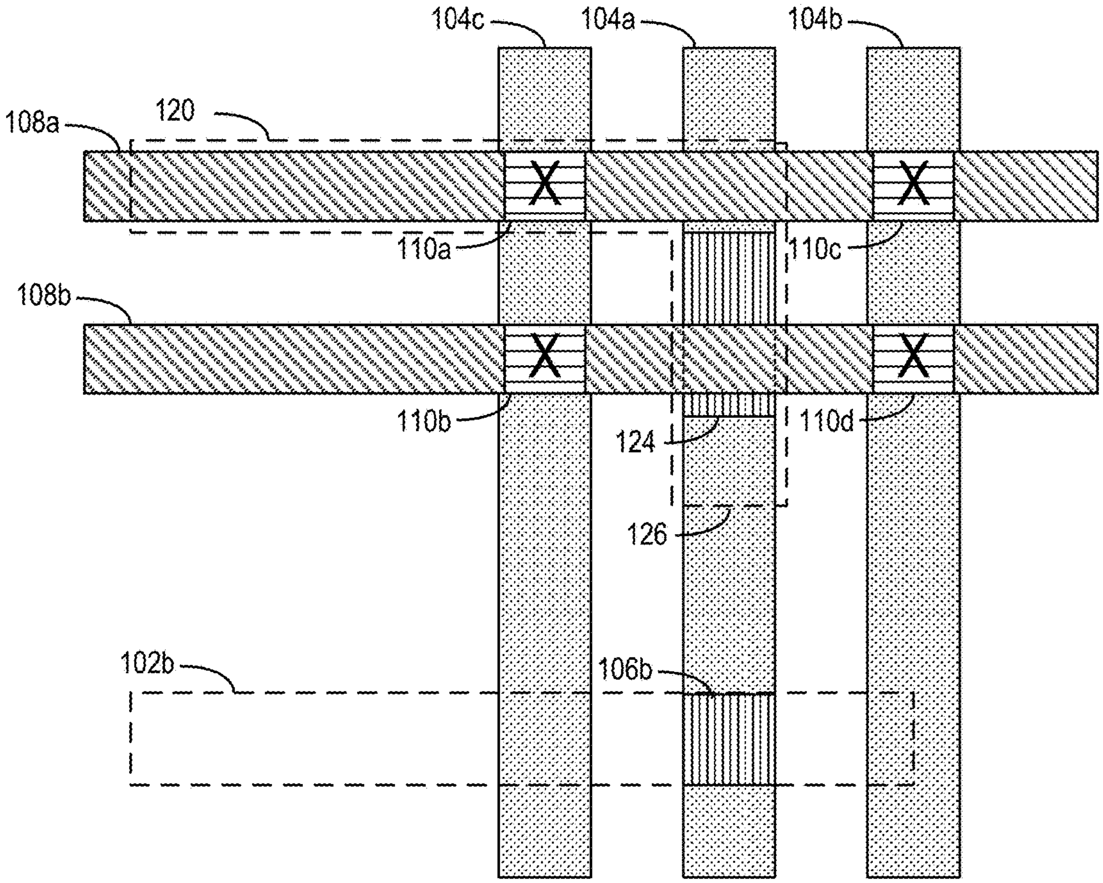
PRIOR ART FIG. 1D
FIG. 1D shows an example diagram for via placement in integrated circuit designs.

Though the use of viabars instead of square vias improves chip yield, their increased size may present challenges during routing, as shown in FIG. 1D. For example, assume that, during the cell placement design stage of an integrated circuit, a viabar 124 is placed to interconnect the interconnect 120 of the first metal layer to the interconnect 104*a* of the second metal layer. Further assume that the integrated circuit of FIG. 1D has more conservative design placement rules compared to FIG. 1B, resulting in a greater minimum distance between vias (or viabars, where applicable). Accordingly, placement of vias 110*a-d*, added during the routing stage, would be invalid due to the presence of the viabar 124.

Figure 2A:
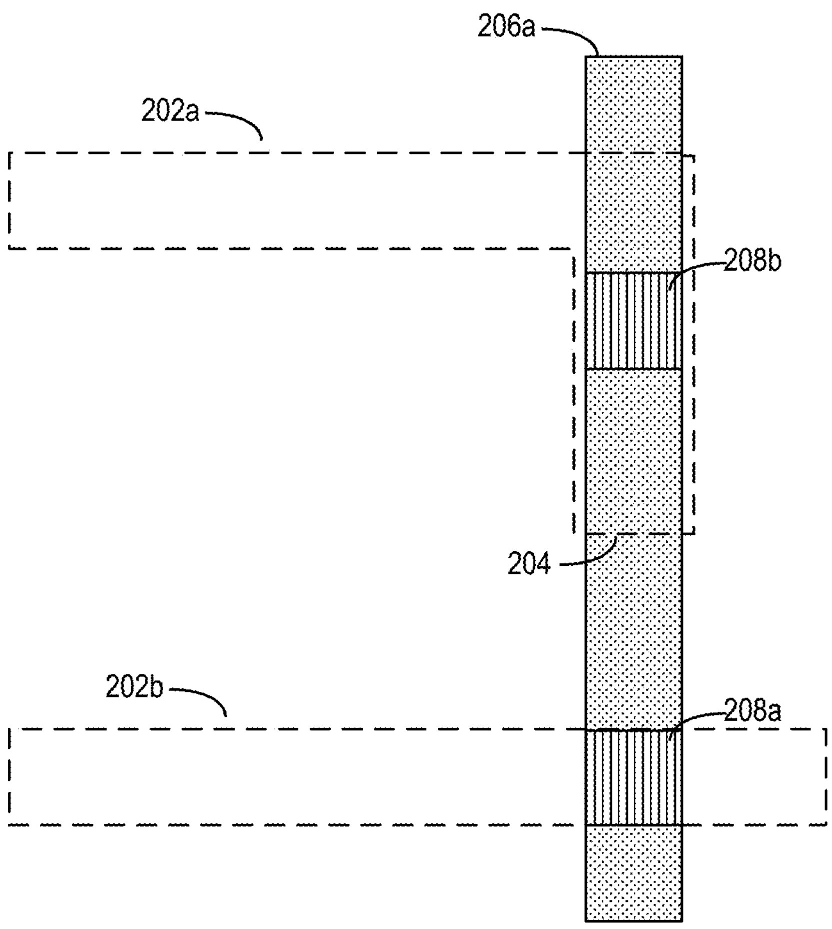
FIG. 2A shows an example diagram for via yielding and routable circuit co-design using viabars in accordance with some embodiments of the present disclosure.
Figure 2B:
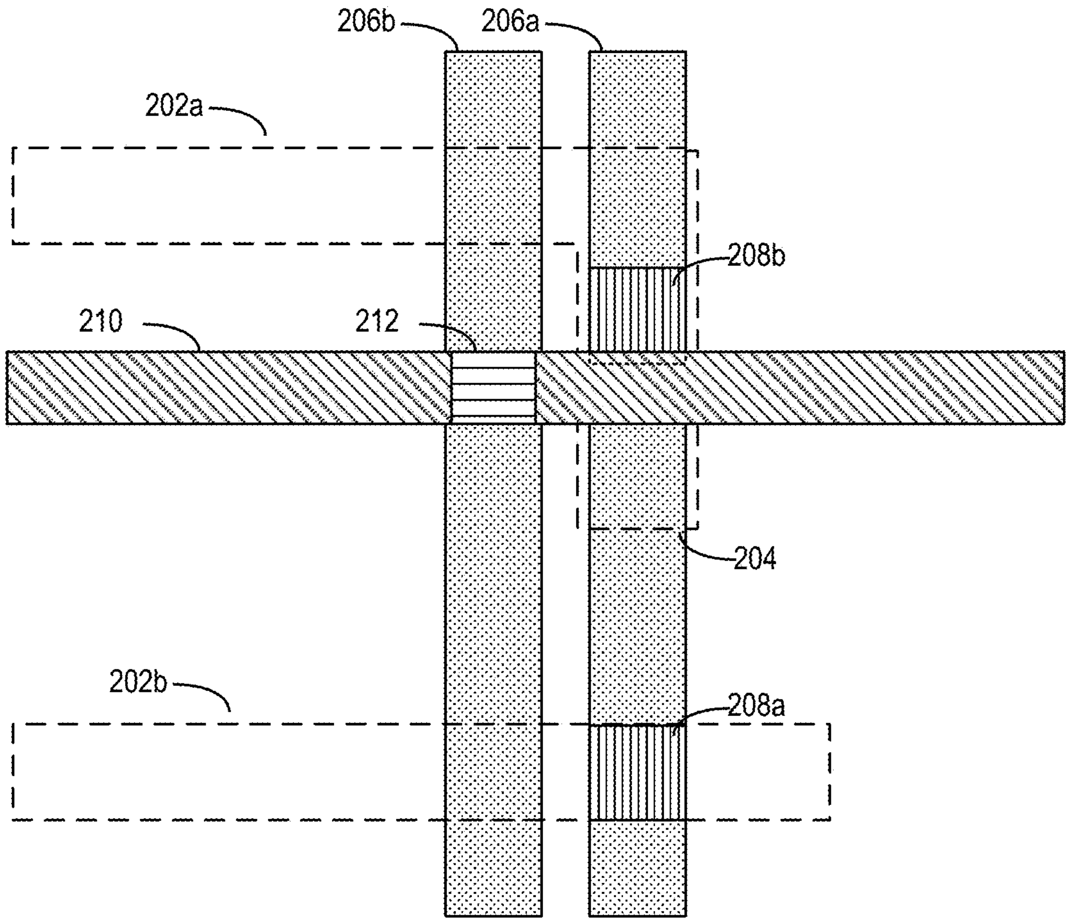
FIG. 2B shows an example diagram for via yielding and routable circuit co-design using viabars in accordance with some embodiments of the present disclosure.
Figure 2C:
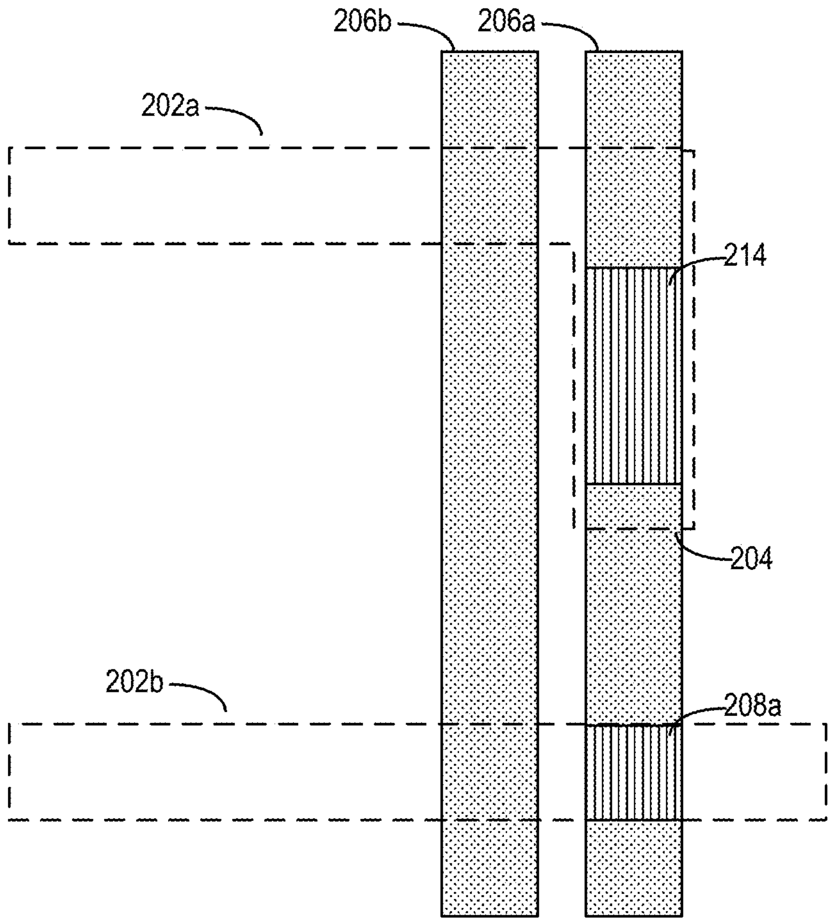
FIG. 2C shows an example diagram for via yielding and routable circuit co-design using viabars in accordance with some embodiments of the present disclosure.

To address these shortcomings, FIGS. 2A-2C show illustrative diagrams for yielding and routable circuit co-design using viabars in accordance with some embodiments of the present disclosure. FIG. 2A shows interconnects 202*a,b* in a first metal layer of an integrated circuit. Interconnect 202*a* includes a slack portion 204 in parallel with an interconnect 206*a* in a second metal layer. Assume that interconnects 202*a,b* and 206*a* are positioned in a block of an integrated circuit during a placement stage. During this placement stage, vias 208*a,b* are positioned to interconnect the first metal layer and the second metal layer by interconnecting the interconnect 206*a* to interconnects 202*a,b*, respectively. As shown, the via 208*b* is positioned in the slack portion 204 of the interconnect 202*a*.

Here, portions of the interconnect 202*a* on opposing sides of the via 208*b* vertically coinciding with the interconnect 206*a* are present. As will be described in further detail below, this provides the ability to later expand the via 208*b* into a viabar, thereby using more area of the interconnect 202*a*. For example, the via 208*b* may be extended toward an end of the slack portion 204 and/or in the opposite direction. Although the via 208*b* is shown at a particular location, it is understood that this location is merely illustrative and that the via 208*b* may be placed at any location on the interconnect 202*a* that is vertically coinciding with the interconnect 206*a* such that the via 208*b* may be extended in one or more directions using the slack portion 204 of the interconnect.

FIG. 2B shows another illustrative diagram for yielding and routable circuit co-design using viabars in accordance with some embodiments of the present disclosure. Here, assume that, for a given integrated circuit block, all cells or other components have been placed, including any interconnecting vias. Next, during a routing stage of integrated circuit design, the various components may be routed using wiring or other interconnects. Here, an interconnect 210 in a third metal layer has been added during the routing stage that is to be connected to interconnect 206*b* in the first metal layer, added during the placement stage, using a via 212. The interconnect 210 and via 212 are added during the routing stage such that they conform to any design rules, including design rules relating to minimum distances between vias. Accordingly, the via 212 is at a distance to the via 208*b* greater than or equal to this minimum distance.

After routing has been performed, it may then be determined if the via 208*b* can be extended into a viabar. In FIG. 2B, extending the via 208*b* into a viabar would result in a viabar having a distance to the via 212 less than the minimum distance defined in the design rules. Accordingly, it is determined that the via 208*b* should not be extended. Alternatively, in FIG. 2C, assume that no interconnect 210 or via 212 were added during the routing stage. After this routing stage, it may be determined whether the via 208*b* can be extended into a viabar 214 by determining if such a viabar 214 would violate the design rules. Here, such a viabar 214 would conform to the design rules due to the via 212 not being present. Accordingly, the via 208*b* is extended into a viabar 214 (e.g., the via 208*b* is replaced with the viabar 214).

In this example, a first end of the viabar 214 is aligned with a first end of the original via 208*b* while a second end of the viabar 214 is closer to the end of the slack portion 204 compared to the second end of the original via 208*b* opposing the first end. In other words, the viabar 214 is created by extending the via 208*b* in a direction toward an end of the slack portion 204. One skilled in the art will appreciate that, in some embodiments, a viabar 214 may be created by extending the via 208*b* in the opposing direction, or both directions. Put differently, a via 208*b* may be extended into a viabar 214 by extending the via 208*b* in any direction such that the viabar 214 remains in a location where the coupled interconnects 202*a* and 206*a* are vertically collocated (e.g., overlapping) and conform to any design rules. For example, the viabar 214 may be extended as far toward the end of the slack portion 204 as desired provided that a space between an edge of the viabar 214 and the end of the slack portion satisfies any design rules defining an amount of encapsulation around vias or viabars, or any other applicable design rules as can be appreciated.

In the examples of FIGS. 2A-2C, during the integrated circuit design process, components (e.g., interconnects, cells, and the like) are placed, including any required vias. Some of these interconnects may include slack portions into which vias may be extended. Next, the routing stage may introduce additional vias, interconnects, and the like. After the routing stage is complete, any via able to be extended using a slack portion of one of their coupled interconnects may be extended, thereby replacing that via with a viabar. The inclusion of slack in the interconnects during the placement stage allows for component placement to be performed while taking into account the shape and space requirements caused by this added slack. Instead of placing viabars during the placement stage, only vias are used. This allows for routing to be performed without any complications caused by viabars being present. Once routing is complete, viabars may be added by extending those vias able to do so while still conforming with the design rules of the integrated circuit. Thus, the integrated circuit design receives the yield benefit of any added viabars while avoiding any routing difficulties that would be caused by their presence during the routing process.

While some slack portions may be used to extend vias into viabars, it may be possible that some of these vias may not be extended due to component placement or routing decisions. Accordingly, in some embodiments, the resulting integrated circuit may include one or more interconnects with slack portions having viabars and one or more other interconnects having slack portions with vias. Thus, these one or more interconnects may include a portion on one or more sides of the via greater than a minimum amount defined by the one or more design rules. Put differently, a given interconnect may have, on one or more sides of a via, a portion vertically coinciding with another interconnect coupled by the via and also exceeding a minimum amount defined by the one or more design rules (e.g., a minimum amount of enclosure).

Figure 3:
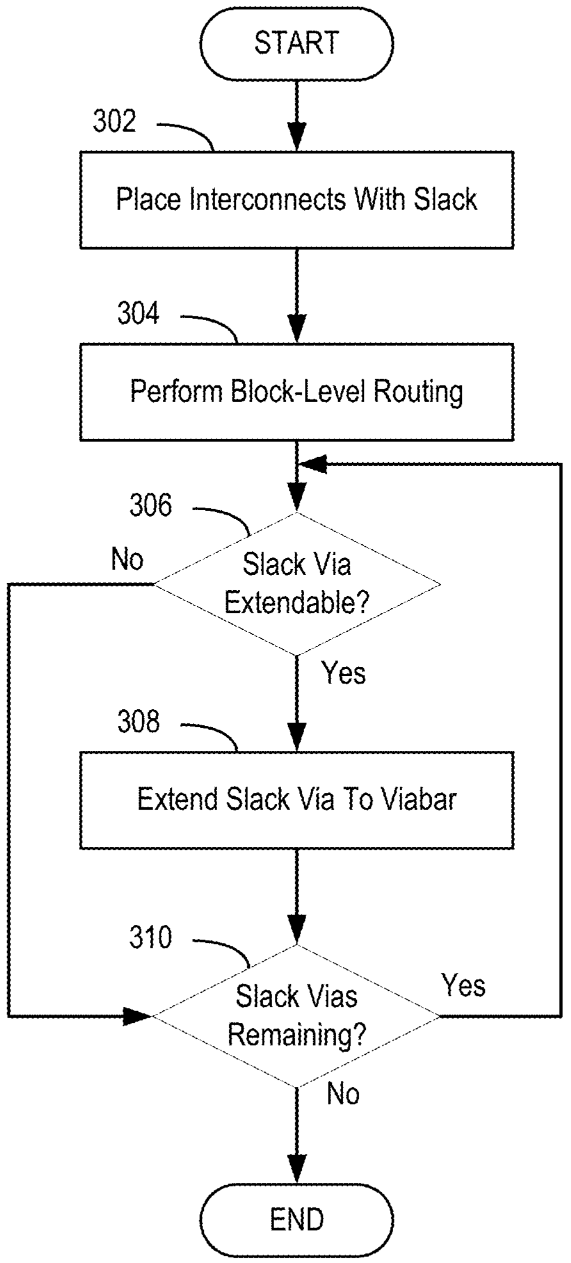
FIG. 3 shows an example flowchart for via yielding and routable circuit co-design using viabars in accordance with some embodiments of the present disclosure.

FIG. 3 sets forth an example flow chart for yielding and routable circuit co-design using viabars in accordance with some embodiments of the present disclosure. Beginning at step 302, during the cell placement stage of integrated circuit design, interconnects in various metal layers are placed, with some of these interconnects including slack portions. Such interconnects are internal to cells (inverters, nands, etc.). Also during this placement stage, vias may be placed in the design in order to couple various pairs of interconnects. Some of these vias, hereinafter referred to as "slack vias" may be placed on a location where the slack portion of a first interconnect to be coupled vertically coincides (e.g., runs parallel) with the second interconnect to be coupled. At step 304, block-level routing is performed in order to couple the various components of an integrated circuit block. For example, wires may be placed in the design and any vias necessary to couple these wires to other interconnects (e.g., in metal layers) may also be placed.

After performing the block-level routing, the process moves to step 306 where it is determined if a slack via is extendable. A slack via is extendable where the slack via may be extended in one or more directions in a slack portion into which the slack via is placed while also conforming to all design rules for the integrated circuit. If the slack via is extendable, the process advances to step 308 where the slack via is extended into a viabar. The slack via is extended into a viabar by replacing the slack via with a viabar that occupies a location having an area greater than and encompassing the area of the slack via. The process then advances to step 310 where it is determined if any slack vias remain (e.g., if any slack vias have not been checked to see if they can be extended into a viabar). If, at step 306, it is determined that a given slack via cannot be extended, the process advances to step 310. If, at step 310, it is determined that any slack vias are remaining, the process returns to step 306. Otherwise, the process ends.

Yielding and routable circuit co-design using viabars in accordance with the present application is generally implemented with computers, that is, with automated computing machinery. For further explanation, therefore, FIG. 4 sets forth a block diagram of computing machinery including an exemplary computer 400 configured for yielding and routable circuit co-design using viabars according to certain embodiments. The computer 400 of FIG. 4 includes at least one computer processor 402 or 'CPU' as well as random access memory 404 ('RAM') which is connected through a high speed memory bus 406 and bus adapter 408 to processor 402 and to other components of the computer 400.

Stored in RAM 404 is an operating system 410. Operating systems useful in computers configured for yielding and routable circuit co-design using viabars according to certain embodiments include UNIX™, Linux™, Microsoft Windows™, and others as will occur to those of skill in the art. The operating system 410 in the example of FIG. 4 is shown in RAM 404, but many components of such software typically are stored in non-volatile memory also, such as, for example, on data storage 412, such as a disk drive.

Figure 4:
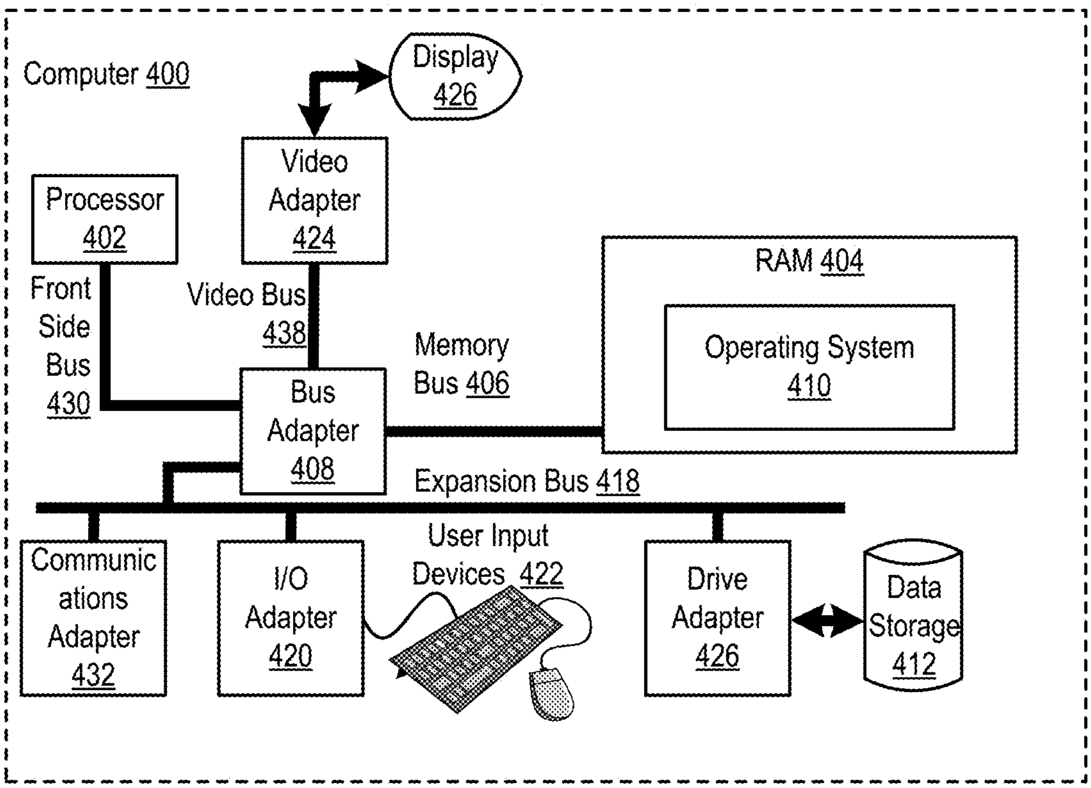
FIG. 4 shows a block diagram of an example computer for yielding and routable circuit co-design using viabars according to some embodiments of the present disclosure.

The computer 400 of FIG. 4 includes disk drive adapter 416 coupled through expansion bus 418 and bus adapter 408 to processor 402 and other components of the computer 400. Disk drive adapter 416 connects non-volatile data storage to the computer 400 in the form of data storage 412. Disk drive adapters useful in computers configured for yielding and routable circuit co-design using viabars according to certain embodiments include Integrated Drive Electronics ('IDE') adapters, Small Computer System Interface ('SCSI') adapters, and others as will occur to those of skill in the art. In some embodiments, non-volatile computer memory is implemented as an optical disk drive, electrically erasable programmable read-only memory (so-called 'EEPROM' or 'Flash' memory), RAM drives, and so on, as will occur to those of skill in the art.

The example computer 400 of FIG. 4 includes one or more input/output ('I/O') adapters 420. I/O adapters implement user-oriented input/output through, for example, software drivers and computer hardware for controlling output to display devices such as computer display screens, as well as user input from user input devices 422 such as keyboards and mice. The example computer 400 of FIG. 4 includes a video adapter 424, which is an example of an I/O adapter specially designed for graphic output to a display device 426 such as a display screen or computer monitor. Video adapter 424 is connected to processor 402 through a high speed video bus 438, bus adapter 408, and the front side bus 430, which is also a high speed bus.

The exemplary computer 400 of FIG. 4 includes a communications adapter 432 for data communications with other computers and for data communications with a data communications network. Such data communications are carried out serially through RS-232 connections, through external buses such as a Universal Serial Bus ('USB'), through data communications networks such as IP data communications networks, and/or in other ways as will occur to those of skill in the art. Communications adapters implement the hardware level of data communications through which one computer sends data communications to another computer, directly or through a data communications network. Examples of communications adapters useful in computers configured for yielding and routable circuit co-design using viabars according to certain embodiments include modems for wired dial-up communications, Ethernet (IEEE 802.3) adapters for wired data communications, and 802.11 adapters for wireless data communications.

Figure 5:
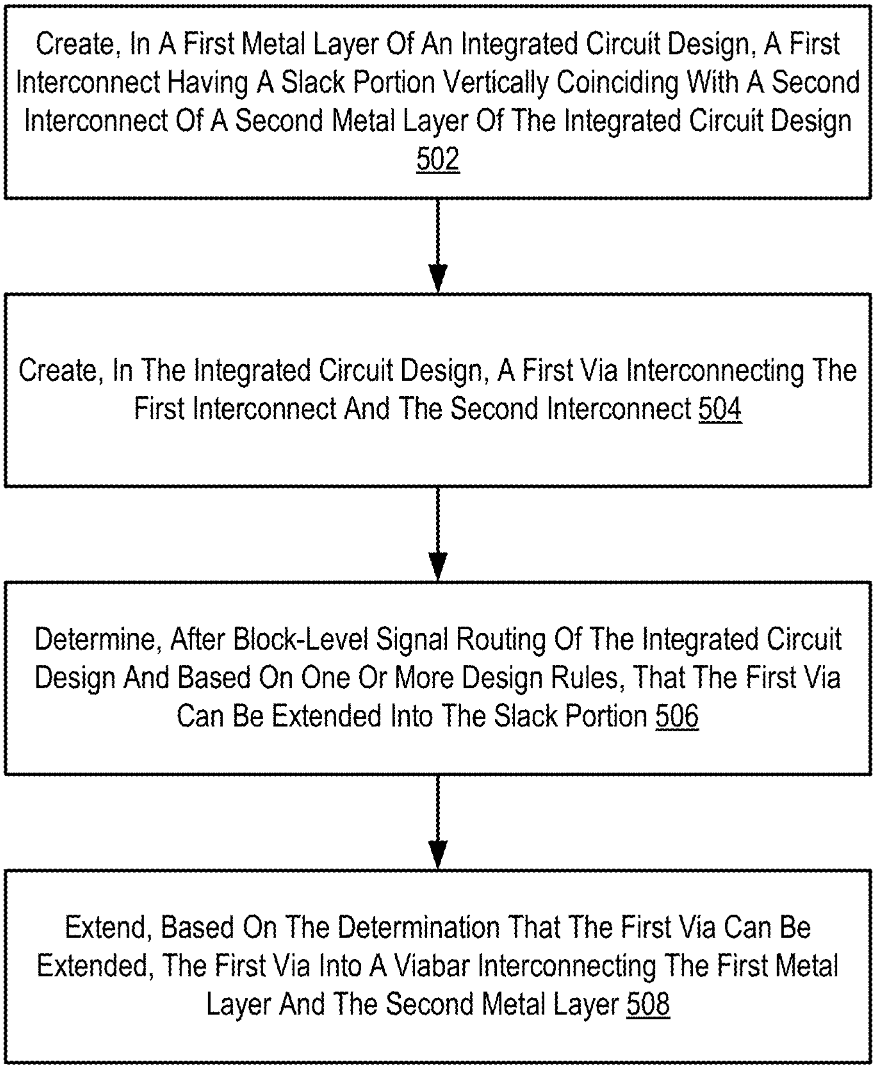
FIG. 5 shows a flowchart of an example method for yielding and routable circuit co-design using viabars according to some embodiments of the present disclosure.

For further explanation, FIG. 5 shows a flowchart of an example method for yielding and routable circuit co-design using viabars according to some embodiments of the present disclosure. The method of FIG. 5 may be performed, for example, during the design phase of an integrated circuit block. The method of FIG. 5 includes creating 502, in a first metal layer of an integrated circuit design, a first interconnect having a slack portion vertically coinciding with a second interconnect of a second metal layer of the integrated circuit design. For example, a portion of the first interconnect other than the slack portion may run in a first direction while the second interconnect runs in a second direction perpendicular to the first direction. The slack portion of the first interconnect may therefore also run in a direction parallel to the second interconnect and therefore also run perpendicular to the other portion of the first interconnect. In other words, in some embodiments, the slack portion may be orthogonal to another portion of the first interconnect, thereby forming a right angle in the first interconnect.

The method of FIG. 5 also includes creating 504, in the integrated circuit design, a first via interconnecting the first interconnect and the second interconnect. The first via may include, for example, a square via or a substantially square via. The via may be placed, in the integrated circuit design, at a location where the first interconnect and the second interconnect vertically coincide. In some embodiments, as the slack portion of the first interconnect vertically coincides with the second interconnect, the first via may be at least partially placed in the slack portion of the first interconnect. The first via is positioned such that, after block-level signal routing, the first via may be extended into a viabar provided that such extension would not violate any design rules of the integrated circuit.

The method of FIG. 5 also includes determining 506, after block-level signal routing of the integrated circuit design and based on one or more design rules, that the first via can be extended into the slack portion. As the block-level signal routing may introduce additional vias or other components to the integrated circuit design, these additional vias or components may affect whether the first via can be extended into the slack portion. Here, the first via can be extended into the slack portion as the extended first via (e.g., a viabar) will not violate any design rules.

The method of FIG. 5 also includes extending 508, based on the determination that the first via can be extended, the first via into a viabar interconnecting the first metal layer and the second metal layer. Extending 508 the first via causes the first via to be replaced in the integrated circuit design with a viabar. In some embodiments, the viabar has a width equal or substantially equal to the width of the first via. The viabar has a length greater than the length of the first via. For example, in some embodiments, the viabar has a length twice the length of the first via. In some embodiments, the viabar has a length greater than twice the length of the first via. The viabar is positioned in a location where the first interconnect and the second interconnect vertically coincide, including the slack portion of the first interconnect. In some embodiments, extending the first via into a viabar includes extending the first via in one or more directions. The viabar, after placement, satisfies the one or more design rules for the integrated circuit.

Figure 6:
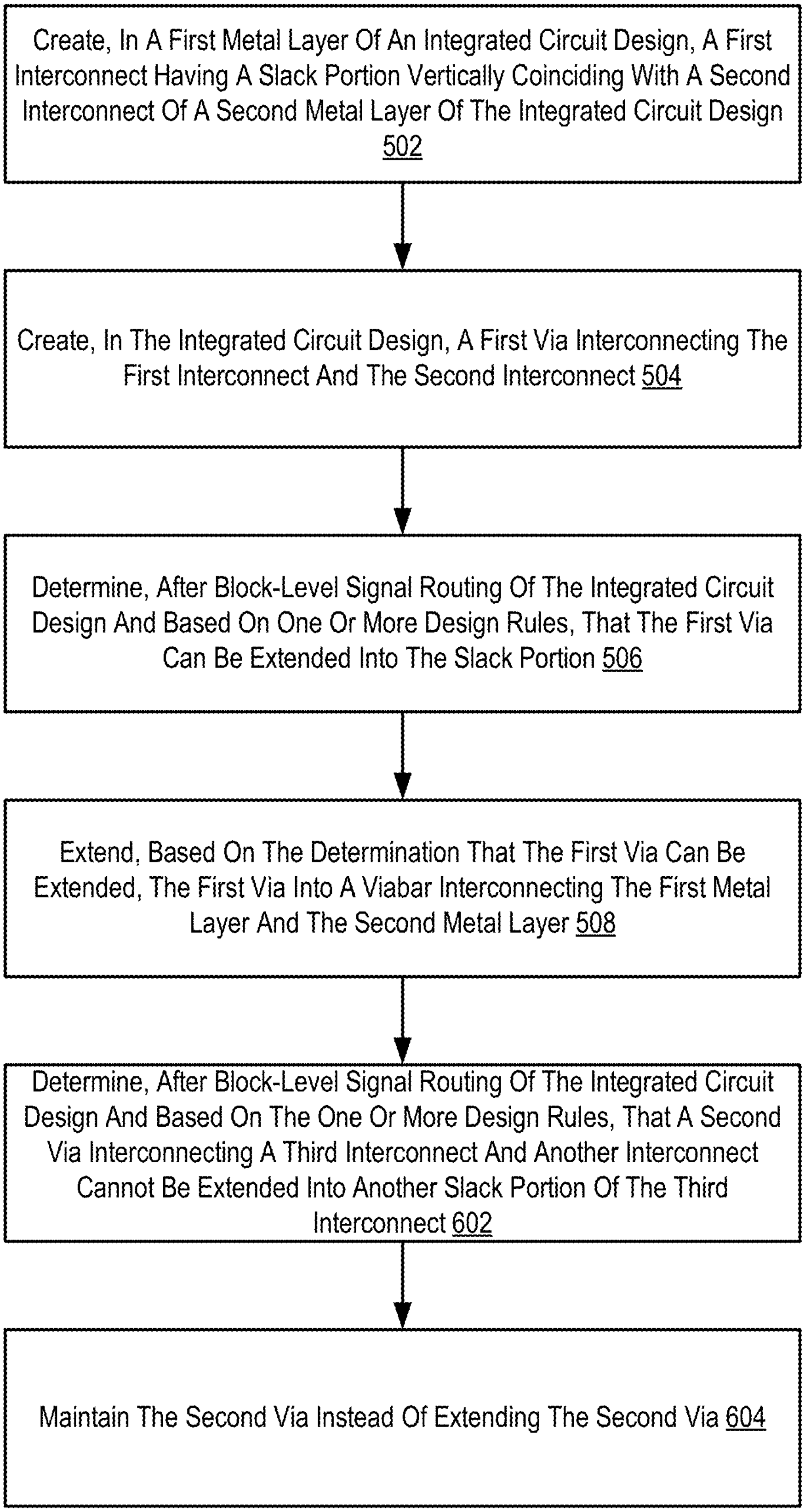
FIG. 6 shows a flowchart of another example method for yielding and routable circuit co-design using viabars according to some embodiments of the present disclosure.

For further explanation, FIG. 6 sets forth a flowchart of an example method of yielding and routable circuit co-design using viabars in accordance with some embodiments of the present disclosure. The method of FIG. 6 is similar to FIG. 5 in that the method of FIG. 6 also includes: creating 502, in a first metal layer of an integrated circuit design, a first interconnect having a slack portion vertically coinciding with a second interconnect of a second metal layer of the integrated circuit design; creating 504, in the integrated circuit design, a first via interconnecting the first interconnect and the second interconnect; determining 506, after block-level signal routing of the integrated circuit design and based on one or more design rules, that the first via can be extended into the slack portion; and extending 508, based on the determination that the first via can be extended, the first via into a viabar interconnecting the first metal layer and the second metal layer.

The method of FIG. 6 differs from FIG. 5 in that the method of FIG. 6 also includes determining 602, after block-level signal routing of the integrated circuit design and based on the one or more design rules, that a second via interconnecting a third interconnect and another interconnect cannot be extended into another slack portion of the third interconnect. The other interconnect may include the first interconnect, the second interconnect, or another interconnect as can be appreciated. This second via is placed at a location where the third interconnect and the other interconnect vertically coincide such that the second via may potentially be extended using the slack portion of the third interconnect provided all design rules are satisfied. After placement of all components during block-level signal routing, it is determined that extending this second via into another viabar would violate one or more design rules. Accordingly, the method of FIG. 6 also includes maintaining 604 the second via instead of extending the second via. In other words, the second via remains in the integrated circuit design instead of being replaced by another viabar.

Figure 7:
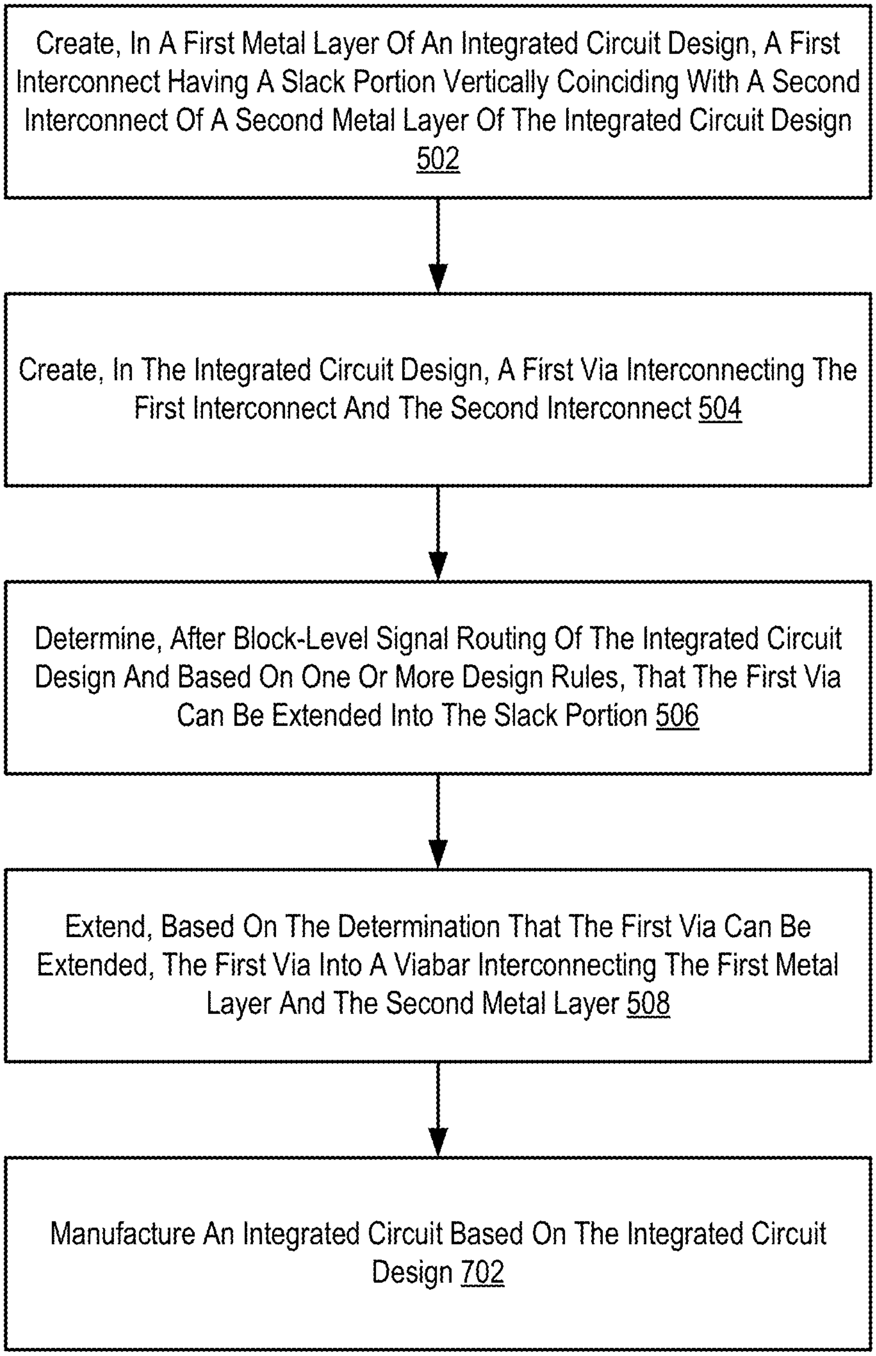
FIG. 7 shows a flowchart of another example method for yielding and routable circuit co-design using viabars according to some embodiments of the present disclosure.

For further explanation, FIG. 7 sets forth a flowchart of an example method of yielding and routable circuit co-design using viabars in accordance with some embodiments of the present disclosure. The method of FIG. 7 is similar to FIG. 5 in that the method of FIG. 7 also includes: creating 502, in a first metal layer of an integrated circuit design, a first interconnect having a slack portion vertically coinciding with a second interconnect of a second metal layer of the integrated circuit design; creating 504, in the integrated circuit design, a first via interconnecting the first interconnect and the second interconnect; determining 506, after block-level signal routing of the integrated circuit design and based on one or more design rules, that the first via can be extended into the slack portion; and extending 508, based on the determination that the first via can be extended, the first via into a viabar interconnecting the first metal layer and the second metal layer.

The method of FIG. 7 differs from FIG. 5 in that the method of FIG. 7 also includes manufacturing 702 an integrated circuit based on the integrated circuit design. The manufactured integrated circuit includes components placed and connections established according to the integrated circuit design. The integrated circuit design, and therefore the integrated circuit, satisfies all design rules for the integrated circuit. In some embodiments, the resulting integrated circuit may include one or more interconnects with slack portions having viabars and one or more other interconnects having slack portions with vias. Thus, these one or more interconnects may include a portion on one or more sides of the via greater than a minimum amount defined by the one or more design rules. Put differently, a given interconnect may have, on one or more sides of a via, a portion vertically coinciding with another interconnect coupled by the via and also exceeding a minimum amount defined by the one or more design rules (e.g., a minimum amount of enclosure.

In view of the explanations set forth above, readers will recognize that the benefits of yielding and routable circuit co-design using viabars according to embodiments of the present invention include improved performance of a computing system by allowing for improved chip yield by using viabars while allowing for block-level routing to be performed without any constraints introduced by the presence of viabars prior to routing.

Exemplary embodiments of the present invention are described largely in the context of a fully functional computer system for yielding and routable circuit co-design using viabars. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of yielding and routable circuit co-design using viabars, the method comprising:

creating, in a first metal layer of an integrated circuit design, a first interconnect having a slack portion vertically coinciding with a second interconnect of a second metal layer of the integrated circuit design;

creating, in the integrated circuit design, a first via interconnecting the first interconnect and the second interconnect;

determining, after block-level signal routing of the integrated circuit design and based on one or more design rules, that the first via can be extended into the slack portion; and extending, based on the determination that the first via can be extended, the first via into a viabar interconnecting the first metal layer and the second metal layer.

2. The method of claim 1, further comprising:

determining, after block-level signal routing of the integrated circuit design and based on the one or more design rules, that a second via interconnecting a third interconnect and another interconnect cannot be extended into another slack portion of the third interconnect; and maintaining the second via instead of extending the second via.

3. The method of claim 1, wherein the one or more design rules comprise a minimum via-to-via distance.

4. The method of claim 1, wherein the one or more design rules comprise an enclosure limit.

5. The method of claim 1, wherein the slack portion of the first interconnect is orthogonal to another portion of the first interconnect.

6. The method of claim 1, wherein the slack portion of the first interconnect is parallel to the second interconnect.

7. The method of claim 1, further comprising manufacturing an integrated circuit based on the integrated circuit design.

8. The method of claim 1, wherein the viabar has a width substantially similar to another via in the integrated circuit chip.

9. The method of claim 1, wherein the viabar has a length substantially double a width of the viabar.

10. The method of claim 1, wherein the viabar has a length greater than double a width of the via.

11. The method of claim 1, wherein the slack portion, after creating the first via, exceeds a minimum length defined by the one or more design rules.

12. An integrated circuit comprising:

a first metal layer having a first interconnect comprising a slack portion;

a second metal layer having a second interconnect;

a viabar interconnecting the first interconnect and the second interconnect at a location where the slack portion vertically coincides with the second interconnect;

a third metal layer having a third interconnect comprising another slack portion; and a via interconnecting the third interconnect with another interconnect, wherein a distance between the via and an end of the other slack portion exceeds a minimum defined by one or more design rules.

13. The integrated circuit of claim 12, wherein the distance between the via and the end of the other slack portion is greater than twice the length of the via.

14. The integrated circuit of claim 12, wherein the integrated circuit conforms to the one or more design rules.

15. The integrated circuit of claim 14, wherein the one or more design rules comprise a minimum via-to-via distance.

16. The integrated circuit of claim 14, wherein the one or more design rules comprise an enclosure limit.

17. The integrated circuit of claim 11, wherein the slack portion of the first interconnect is orthogonal to another portion of the first interconnect.

18. The integrated circuit of claim 11, wherein the slack portion of the first interconnect is parallel to the second interconnect.

19. The integrated circuit of claim 11, wherein the viabar has a width substantially similar to the via.

20. The integrated circuit of claim 11, wherein the viabar has a length substantially double a width of the via.

* * * * *